United States Patent
Fjelstad

[11] Patent Number: 6,093,584
[45] Date of Patent: *Jul. 25, 2000

[54] METHOD FOR ENCAPSULATING A SEMICONDUCTOR PACKAGE HAVING APERTURES THROUGH A SACRIFICIAL LAYER AND CONTACT PADS

[75] Inventor: Joseph Fjelstad, Sunnyvale, Calif.

[73] Assignee: Tessera, Inc., San Jose, Calif.

[*] Notice: This patent is subject to a terminal disclaimer.

[21] Appl. No.: 09/085,352

[22] Filed: May 27, 1998

Related U.S. Application Data

[63] Continuation of application No. 08/634,464, Apr. 18, 1996, Pat. No. 6,001,671.

[51] Int. Cl.[7] ................................................. H01L 21/44
[52] U.S. Cl. .......................... 438/127; 438/108; 438/110; 438/119; 438/124; 438/126
[58] Field of Search .................... 438/108, 126, 438/127, 119, FOR 367, FOR 379, FOR 384, 110, 124, 112; 257/686, 778, 787, 784, 698

[56] References Cited

U.S. PATENT DOCUMENTS

| | | | |
|---|---|---|---|
| 4,530,152 | 7/1985 | Roche et al. | 29/588 |
| 5,200,362 | 4/1993 | Lin et al. | 438/126 |
| 5,436,203 | 7/1995 | Lin | 438/126 |
| 5,468,999 | 11/1995 | Lin et al. | 257/784 |
| 5,487,999 | 1/1996 | Farnworth | 438/17 |
| 5,557,150 | 9/1996 | Veroit et al. | 257/787 |
| 6,001,671 | 12/1999 | Fjelstad | 438/112 |

FOREIGN PATENT DOCUMENTS

| | | |
|---|---|---|
| 63-177430 | 7/1988 | Japan . |
| 1-231133 | 9/1989 | Japan . |
| 1-231134 | 9/1989 | Japan . |
| 1-297848 | 11/1989 | Japan . |
| 2-12931 | 1/1990 | Japan . |
| 2-77137 | 3/1990 | Japan . |
| 3-94459 | 4/1991 | Japan . |
| 3-239349 | 10/1991 | Japan . |
| 5-198607 | 8/1993 | Japan . |

*Primary Examiner*—Olik Chaudhuri
*Assistant Examiner*—Alonzo Chambliss
*Attorney, Agent, or Firm*—Lerner, David, Littenberg, Krumholz &Mentlik, LLP

[57] ABSTRACT

A method of manufacturing a semiconductor chip package. A sacrificial layer is used as a base to selectively form an array of conductive pads such that a central region is defined by the pads. A back surface of a semiconductor chip is next attached to the sacrificial layer within the central region between the pads so that the contact bearing surface of the chip faces away from the sacrificial layer. The chip contacts are then electrically connected to respective pads, typically by wire bonding a wire therebetween. A curable, dielectric liquid encapsulant is then deposited on the sacrificial layer such that the pads, electrical connections and chip are fully encapsulated, as by an overmolding operation. The encapsulant is then cured and the sacrificial layer is either completely removed or is selectively removed to expose a surface of the pads for electrical attachment to a PWB and the back surface of the chip for creating a direct thermal path from the chip to the PWB.

3 Claims, 9 Drawing Sheets

6,093,584

METHOD FOR ENCAPSULATING A SEMICONDUCTOR PACKAGE HAVING APERTURES THROUGH A SACRIFICIAL LAYER AND CONTACT PADS

CROSS SECTION TO RELATED APPLICATIONS

The present application is a continuation of U.S. Pat. application Ser. No. 08/634,464 filed Apr. 18, 1996 now U.S. Pat. No. 6,001,671, the disclosure of which is hereby incorporated by reference herein.

FIELD OF THE INVENTION

The present invention generally relates to microelectronic assemblies, and more specifically it relates to semiconductor chip packages.

BACKGROUND OF THE INVENTION

The semiconductor chip packaging industry is a highly competitive business in which the packaging companies are waging an on-going battle to reduce the costs associated with packaging their own chips and, many times, the chips owned by other parties. New technologies are constantly being investigated in order to reduce the packaging cost while producing packaging structures and processes which produce similar or superior results. Further, there is on-going pressure from the electronic industry to reduce the internal impedances of semiconductor packages so that the semiconductor makers may increase the speed of their chips without experiencing significant signal degradation thereby decreasing the processing and/or response time a user of a finished electronic product will encounter when requesting the electronic product to perform a given task. Further still, the electronic industry requires that the chips are packaged in smaller and smaller form factors so that the packaged chips take up less space on a supporting circuitized substrate (such as a printed wiring board, "PWB"). It is also important that the thickness dimension of the packaged chips is reduced so that the same operational circuitry may be fit into a smaller area thereby allowing for more portability (size, weight, etc.) for the resulting finished electronic product and/or allowing for an increase in a product's processing power without also increasing its size. As the packaged chips are made smaller and placed closer and closer together on the PWB, the chips will produce more heat and will receive more heat from the adjacent chips. It is therefore also very important to provide a direct thermal path to facilitate the removal of heat from the packaged chips.

In response to industry concerns, pin grid array ("PGA") products, in which relatively large conductive pins attach the circuitry in a particular semiconductor package to the circuitry on the PWB, and other such large packaging conventions have been used less frequently in favor of smaller packaging conventions, such as ball grid array ("BGA") packages. In BGA packages, the aforementioned pins are typically replaced by solder balls thereby reducing the height of the packages from the PWB, reducing the area needed to package chips and further allowing for more elegant packaging solutions. The solder balls on a BGA device are generally either disposed in regular grid-like patterns, substantially covering the face surface of the packaged chip (commonly referred to as an "area array") or in elongated rows extending parallel to and adjacent each edge of the front surface of the packaged chip.

BGA and even smaller chip scale packaging ("CSP") technology refer to a large range of semiconductor packages which typically use interconnection processes such as wirebonding, beam lead, tape automated bonding ("TAB") or the like as an intermediate connection step to interconnect the chip contacts to the exposed package terminals. This results in a testable device prior to mechanical attachment to the bond pads on supporting substrate. The BGA/CSP packaged chips are then typically interconnected on a PWB using standard tin-lead solder connections.

Certain packaging designs have nicely met the above stated industry concerns. An example of such a design is shown in U.S. Pat. Nos. 5,148,265 and 5,148,266, the disclosures of which are incorporated herein by reference. In one embodiment, these patents disclose the use of a chip carrier in combination with a compliant layer to provide a cost efficient, low profile CSP.

Despite these and other efforts in the art, still further improvements in interconnection technology would be desirable.

SUMMARY OF THE INVENTION

The present inventive methods solve the aforementioned problems.

In one embodiment of the present invention, a method of making a semiconductor chip package includes the steps of first providing a sacrificial layer. A array of conductive pads or posts are next selectively formed on top of a first surface of the sacrificial layer so that a central region is defined by and is positioned between the pads. A back surface of a semiconductor chip is next attached to the sacrificial layer within the central region so that the contact bearing (or active) surface of the chip faces away from the sacrificial layer. Typically, the chip is attached to the sacrificial layer using a thermally conductive die attach adhesive. The chip contacts are next electrically connected to respective pads using a wirebonding machine to connect a conductive wire therebetween. A curable, dielectric liquid encapsulant is then deposited on the first surface of the sacrificial layer such that the pads, wires and semiconductor chip are all encapsulated. The encapsulant is then cured into a self-supporting form. Typically, a mold is placed on top of the first surface of the sacrificial layer prior to depositing the encapsulant so that the exterior of the package (the encapsulant) may be formed into a desired shape after the encapsulant is injected into the mold and is cured. At least a portion of the sacrificial layer is then removed to expose the bottom surface of the pads and the to provide a direct thermal path to the chip. In some embodiments, all of the sacrificial layer is removed leaving the cured encapsulant and the die attach adhesive as the bottom of the package. Many chips may be packaged simultaneously thereby allowing this process to create individual packaged chips or may be used to create multichip modules after the dicing operation which selectively separates the packaged chips.

In a further embodiment of the present invention, a dielectric polymer sheet may be disposed between the sacrificial layer and the pads such that conductive traces may interconnect the pads and thus the chips in a multichip embodiment.

In a further embodiment of the present invention, the sacrificial layer may be selectively etched on a first surface such that conductive pads protrude therefrom. The back surface of the chip is next attached between the pads in a central region defined by the pads. The chip contacts are wirebonded to respective pads and encapsulant is deposited such that it encapsulates the chip, the wires and the pads. The sacrificial layer is then etched from the exposed side so that

BRIEF DESCRIPTION OF THE DRAWINGS

FIG. 1D-2 shows a top view of FIG. 1D-1 in which several chips back-bonded to a sacrificial layer and electrically connected thereto prior to the encapsulation step, according to the present invention.

FIG. 1G-2 shows a bottom view of a multichip embodiment of FIG. 1G-1 after the sacrificial layer has been removed, according to the present invention.

FIGS. 6A-1 through 6F-1 show a side view of an alternate method of manufacturing a semiconductor package having vias extending from one side of the package to the other, according to the present invention.

FIG. 6A-2 shows a top view of FIG. 6A-1, according to the present invention.

FIG. 6B-2 shows a top view of FIG. 6B-1, according to the present invention.

FIG. 6F-2 shows a bottom view of FIG. 6F-1, according to the present invention.

FIGS. 7F-1 and 7G-1 show a first method of finishing the chip package shown in FIG. 7E, according to the present invention.

FIGS. 7F-2 and 7G-2 show a second method of finishing the chip package shown in FIG. 7E, according to the present invention.

DESCRIPTION OF A PREFERRED EMBODIMENT

Figure 1A:
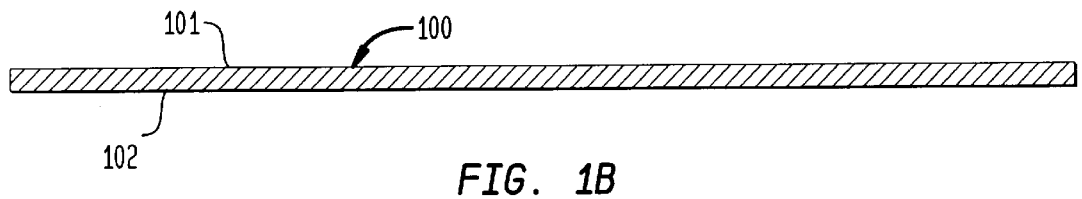
FIGS. 1A through 1G-1 show a side view of a method of manufacturing a semiconductor chip package, according to the present invention.

FIGS. 1A–G show a process for manufacturing inexpensive semiconductor chip packages, according to the present invention. FIG. 1A shows a side view of a sacrificial layer 100 having a first surface 101 and a second surface 102. The sacrificial layer 100 may be comprised of a conductive metallic material, a polymer material or a combination of both a conductive metallic material and a polymer material. Examples of possible sacrificial layer materials include aluminum, copper, steel, iron, bronze, brass, polyimide, polyetherimide, fluropolymer and alloys and combinations thereof. In FIG. 1A, the sacrificial layer is comprised of a sheet of aluminum having an approximate substantially uniform thickness of about 100–200 microns; although, the sacrificial sheet could be thicker or thinner in some embodiments.

Figure 1B:
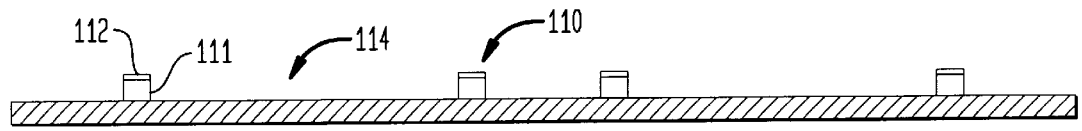

In FIG. 1B, a plurality of pads 110 are selectively formed, typically by an electroplating operation, so that the pads 110 are disposed on and attached to the first surface 101 of the sacrificial layer 100. The pads 110 are arranged on the first surface 101 of the sacrificial layer 100 so as to define a central region 114 between the pads of a particular package group. The pads may be arranged in single rows around the central region 114 or may be arranged in multiple rows in a substantially grid array arrangement, example of which is shown in FIG. 1D-3. The pads 100 in this embodiment are comprised of a first layer of copper 111 and a second layer of gold 112. Typically, there is also a center barrier layer (not shown) of nickel to ensure that the copper and gold layers do not diffuse into one another. The gold layer 112 facilitates a bond which is made by the electrical connection to the chip contacts, as described in more detail below. The height of the pads 110 is not critical so long as a good electrical connection can be made thereto. In some embodiments, the pads may resemble posts. Other examples of permissible pad materials include copper, nickel, gold, rhodium, platinum, silver and alloys and combinations thereof. Typically, in a low pin count package, the pads 110 are all of the same height from the sacrificial layer 100. However, for higher pin count packages or for other reasons, the pads 110 may not all be of the same height from the sacrificial layer 100. Taller pads 110 can be used in outside rows of pads to ensure that the electrical connections between the contacts and the inner pads do not electrically short with the connections between the contacts and the outer pads. This can be useful in cases where the chip contacts are finely spaced or where the contacts are arranged in an area array on the face surface 121 of the chip 100, an example of which is shown in FIG. 1D-3.

Figure 1C:
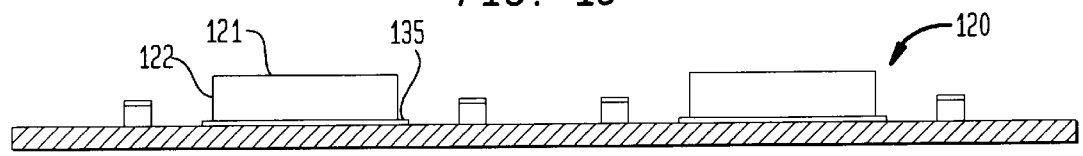

As shown in FIG. 1C, a back surface 122 of a semiconductor chip 120 (or several chips) is next coupled to the sacrificial layer 100 so that the contact bearing, face surface 121 of the chip 120 faces away from the sacrificial layer 100. This arrangement is commonly referred to as "back bonding" a semiconductor chip. Any suitable coupling agent 135 can be used for such back bonding. Preferably, a thermally conductive die attach adhesive is used so that when a heat sink is attached, as described below, there is a more direct thermal path to draw heat away from the chip during thermal cycling. Examples of such preferable adhesive materials include silver filled epoxy, tin-lead solder, boron-nitride, aluminum filled silicone, alumina and copper filled epoxy, among others.

Figures 1, 1D:
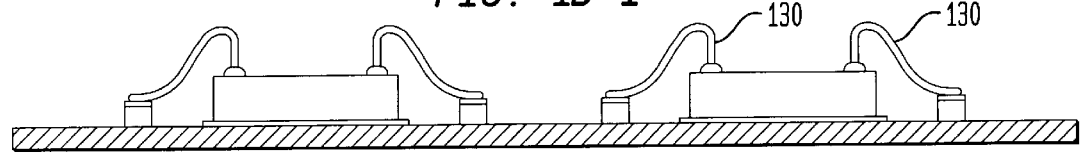

Next, the chip contacts (not shown) on the face surface 121 of the chip 120 are each electrically connected to a respective pad 110 by wirebonding the one to the other, as shown in FIG. 1D-1. The wirebonded connection 130 could take the form of a ball bond/stitch (or wedge) bond combination, as shown, or the wire could be stitch bonded to both the chip contacts and the pads 110. Further other conventions could be used to interconnect the chip contacts and the pads, such as TAB leads, electroformed beam leads, etc. FIG. 1D-2 shows a top view of FIG. 1D-1.

Figure 1E:
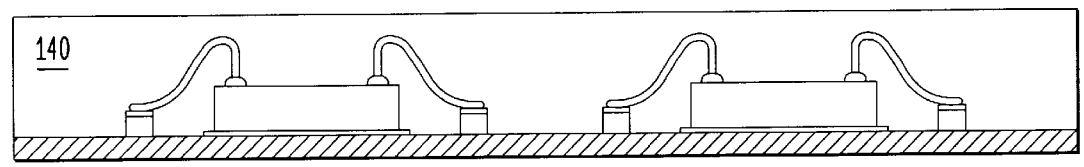

The assembly, including the first surface 101 of the sacrificial layer 100, the pads 110, the chip 120 and the electrical connections, is next encapsulated (or overmolded) by a flowable, curable dielectric material, as by convention semiconductor molding technology, as shown in FIG. 1E. The dielectric material is typically comprised of filled or unfilled standard thermoset or thermo plastic resins as used in the industry, such as epoxy resin, silicone resin or other plastic encapsulating material. The dielectric material is then fully cured.

Figure 1F:
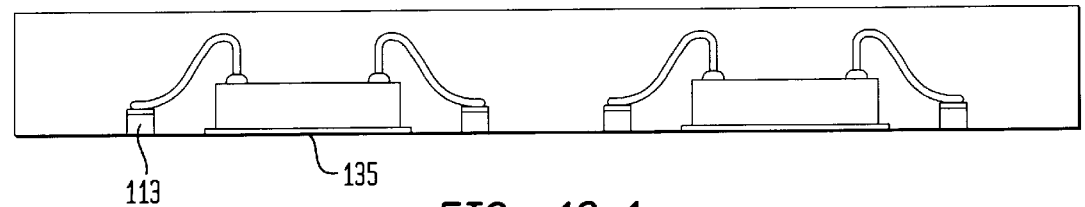

The sacrificial layer 100 is next removed, as shown in FIG. 1F. Here, the sacrificial layer is removed, using an etching operation, so as to expose the bottom surface 113 of the pads 110. The step of removing the sacrificial layer 100 also exposes the thermally conductive die attach adhesive 135. If desired, the sacrificial layer may be more selectively removed to provide added features on the bottom of the finished package, such as taller pads 110 which protrude from the bottom of the package, and/or a heat sink disposed beneath and protruding from the bottom of the bottom of the finished package and attached to the back surface 122 of the chip.

Figures 1, 1G:
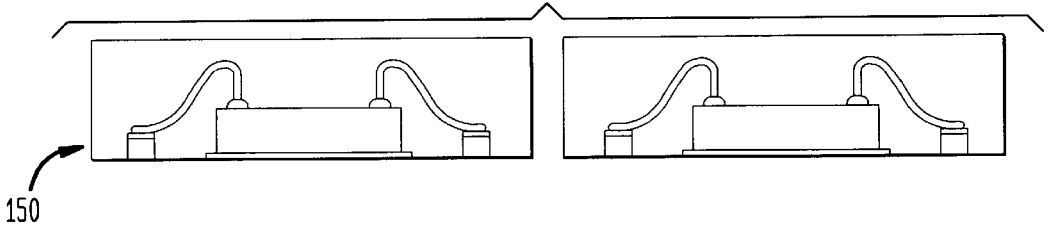
Figures 1, 1D, 2, 3:
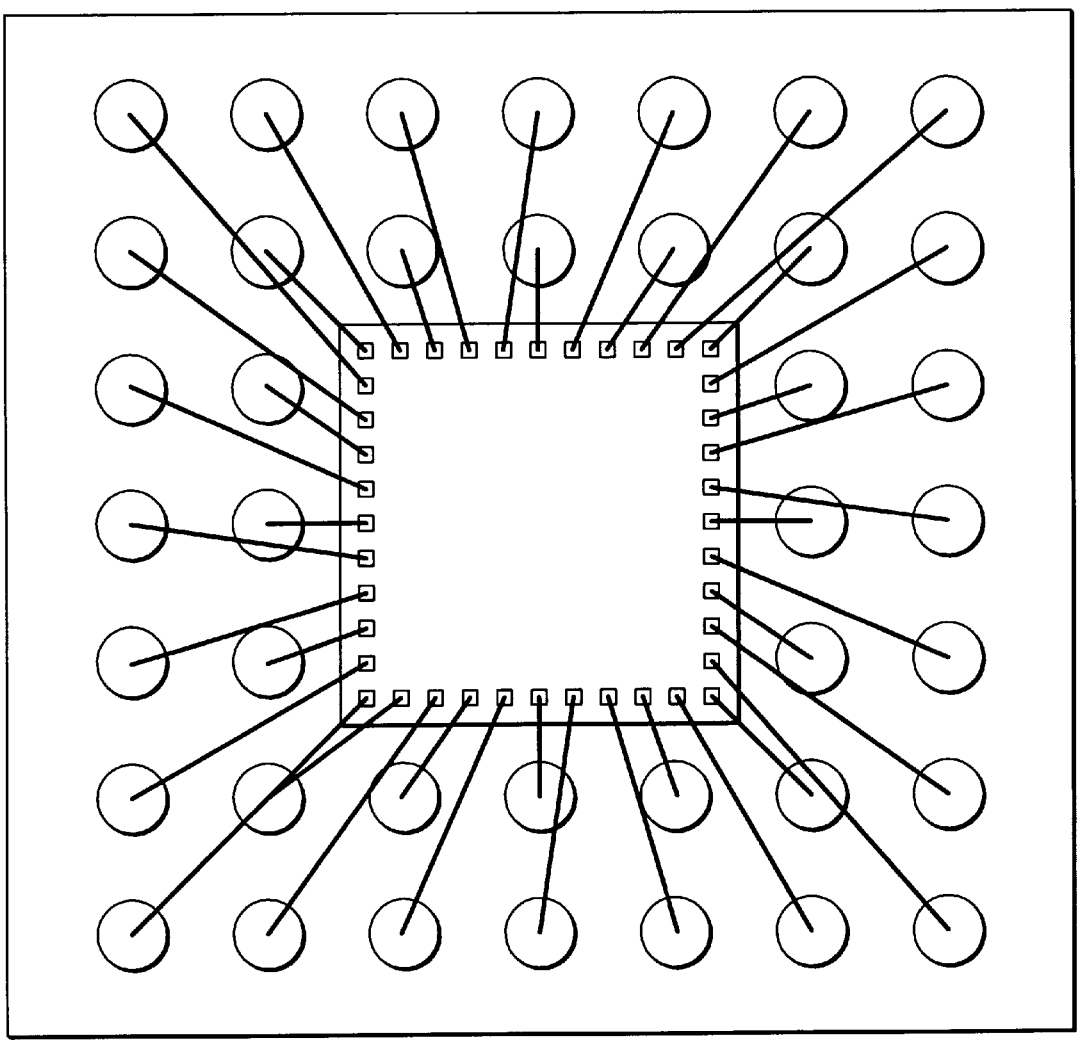

In FIG. 1G-1, the individual packaged chips 150 are "diced" or separated from each other. At this point, the exposed bottom surfaces 113 of the pads 110 may be attached to respective bond pads on the PWB. One method of making such an attachment is to connect solder balls 160 to the bottom surface 113 of the pads 110. The solder balls 160 are typically comprised of a combination of tin and lead and may further coat a solid metal ball such that the solderballs 160 are non-collapsing. FIG. 1G-2 shows a bottom view of a multichip module embodiment of the invention in which the packages are diced so that more than one chip 120 is included in the resulting package. FIG. 1G-2 could also be the top view of the undiced packages, as shown in FIG. 1F. While the above process is shown and described in an embodiment that packages more than one chip simultaneously, the process could also be used to package an individual chip if desired.

Figure 2A:
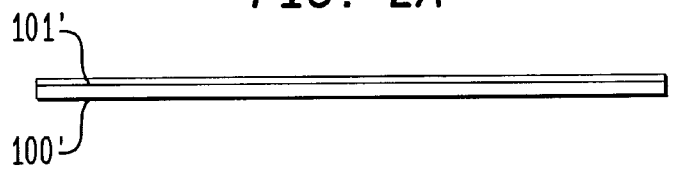
FIGS. 2A through 2E show a side view of an alternate method of manufacturing a semiconductor chip package, according tot he present invention.
Figure 2B:
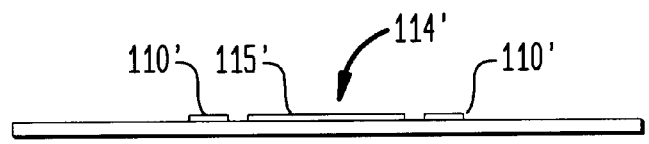
Figure 2C:
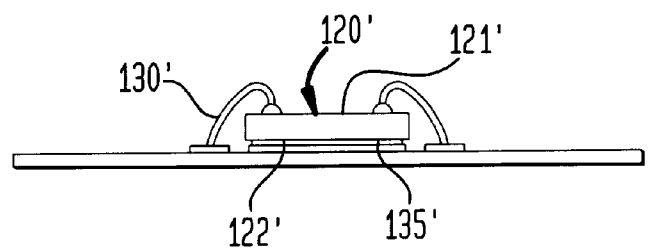
Figure 2D:
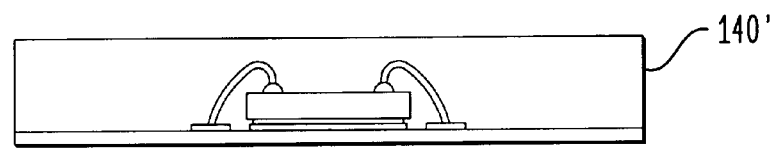
Figure 2E:
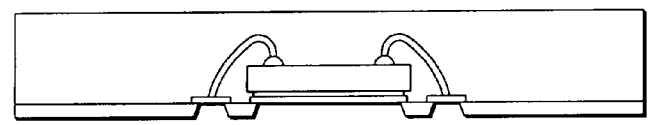
Figures 1, 1D, 2:
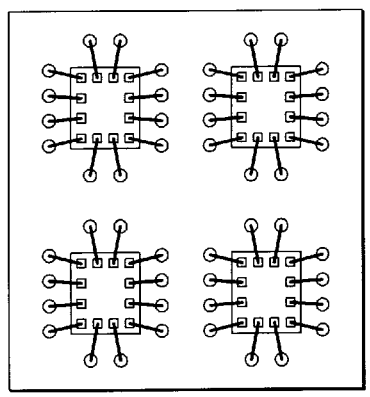
Figures 1, 1G, 2:
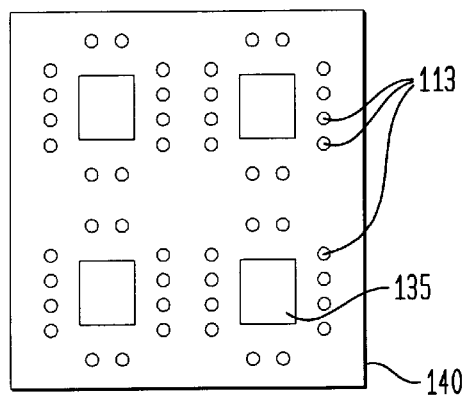
Figure 2F:
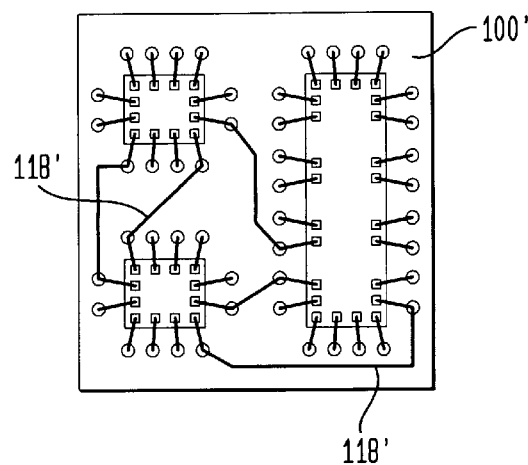
FIG. 2F shows a top view of a multichip package embodiment of FIG. 2E, according to the present invention.
Figure 3:
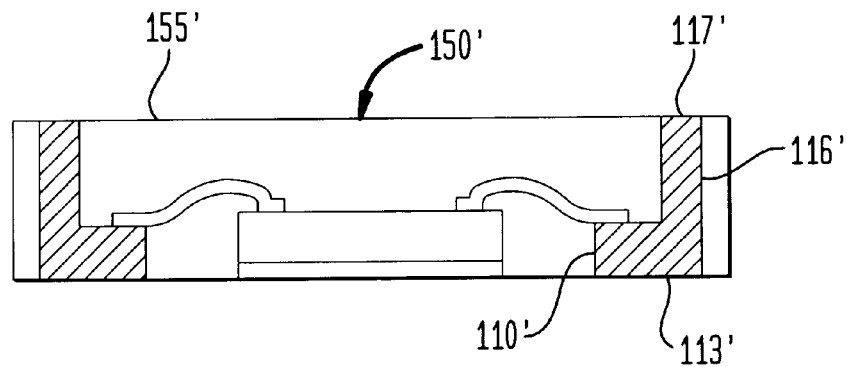
FIG. 3 shows a side view of a chip package having protrusions extending vertically from one side of the package to the other, the protrusions being electrically connected to at least some of the pads, according to the present invention.

In an alternative method of manufacture shown in FIGS. 2A–E, the sacrificial layer is comprised of a dielectric polymer sheet 100' having a conductive layer 101', typically a thin layer of copper, on one surface of the sacrificial layer 100', as shown in FIG. 2A. An array of conductive pads 110' are next photo-lithographically defined by etching away undesired sections of the conductive layer 101' so that the pads 110' define a central region 114' therebetween. Within the central region 114', a central conductive region 115' may also be defined by the pad-forming lithographic process, as shown in FIG. 2B. A back surface 122' of a semiconductor chip 120' is then bonded to the conductive region 115' through the use of the thermally conductive die attach adhesive 135', as discussed in reference to FIG. 1. The chip contacts (not shown) on the exposed face surface 121' of the chip 120' are then electrically connected to respective pads 110' by wirebonding wires 130' therebetween. As discussed above, the elements are next encapsulated in FIG. 2D using a suitable liquid encapsulant for the application and the encapsulant is cured. Portions of the polymer sheet 100' are then removed, as by chemically etching or laser ablation operations, so that the pads 110' and central conductive region 115' are exposed. The packages may then be diced into either individual packages or multichip packages and connected to a PWB with conventional solder. Typically, the central region 115' is connected to the PWB in such a way that heat is drawn away from the chip into the PWB during operation of the package. As shown in the top plan view of FIG. 2F, a multichip package may include chips of different sizes which perform different functions. The addition of dielectric, polymer sheet 100' allows this multi-chip module to have conductive paths 118' interconnecting at least some of the pads 110' within the multichip module thereby allowing signals to be transferred between the chips. It should be noted that if a wiring layer, such as is described in this multichip embodiment, is not needed or desired, the entire polymer sheet 100' may simply be removed by chemically dissolving the sheet leaving the pads and the central conductive region exposed.

FIG. 3 shows a still further embodiment of a packaged chip, similar to the packaged chips shown in FIG. 1G-1. In FIG. 3, however, a conductive protrusion 116' is electrically connected to a respective pad 110' and extends to the top surface 155' of the finished package 150' so that a top surface 117' of the protrusion 116' is exposed. This arrangement allows the bottom surface 113' of the pads 110' to be soldered to a supporting substrate (such as a PWB) while allowing another electronic component and/or semiconductor chip to be electrically connected to the packaged chip 150' via the exposed top surface 117' of the protrusions 116''; thus, creating a chip stacking technique. The protrusions may extend from every pad; however, typically they will extend from less than all of the pads.

Figure 4A:
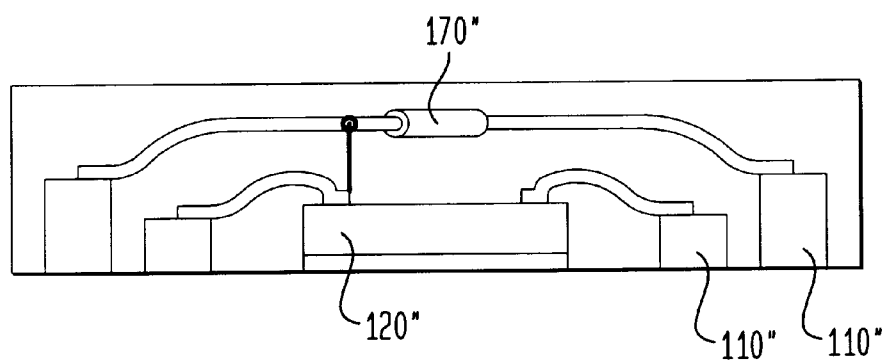
FIG. 4A shows a side view of a chip package having a separate electronic component above the chip in the encapsulated package, according to the present invention.
Figure 4B:
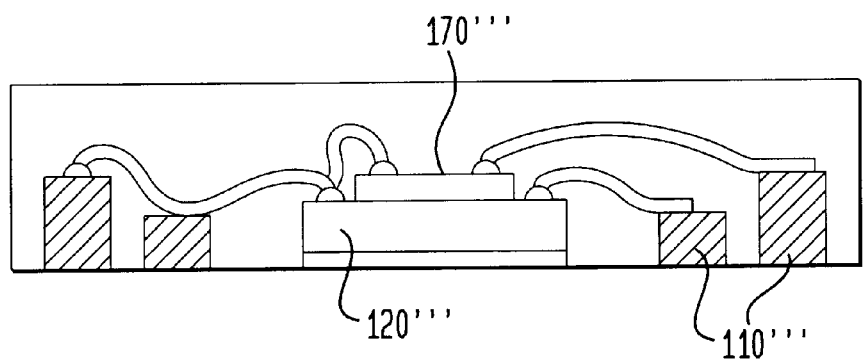
FIG. 4B shows a side view of a chip package having a second semiconductor chip back bonded to the first chip such that the chip contacts of both chips and the pads may be interconnected, according to the present invention.

In a further embodiment, FIG. 4A shows a side view of a microelectronic component 170" which is attached to the chip 120". The contacts on such a microelectronic component may be electrically connected between respective contacts on the chip 120" and/or may be connected to respective pads 110". Where the microelectronic component is a second semiconductor chip 170''', as shown in FIG. 4B, the back surface of the second chip 170''' will be back-bonded to the face surface of the first chip 120''' and the contacts on the second chip may be electrically connected to the contacts on the first chip 120''' and/or to respective pads 110'''. The pads 110''' themselves may also be electrically interconnected.

Figure 5A:
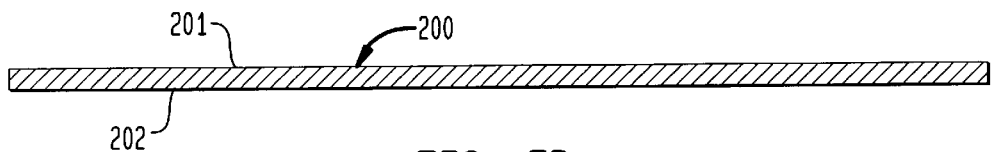
FIGS. 5A through 5H show a side view of an alternate method of manufacturing a semiconductor chip package, according to the present invention.
Figure 5B:
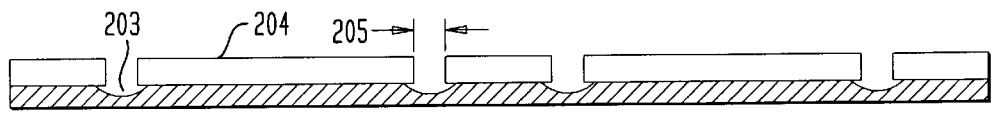

In a further alternative embodiment of the present invention, shown by FIGS. 5A–H, the pads described above may have a more "rivet-like" shape. FIG. 5A shows a sacrificial layer, as earlier described, having a first surface 201 and a second surface 202. In FIG. 5B, a plurality of cavities 203 are removed from the first surface 201 of the sacrificial layer 200. Desirably, an etchable layer is used for the sacrificial layer so that the cavities 203 may simply be etched into the sacrificial layer 200 in the form desired. A second photo-imageable dielectric layer 204, such as standard photo-resist, is disposed on top of the first surface 201 of the sacrificial layer 200 and apertures 205 are developed and removed using standard photo-lithographic techniques so as to control the creation and placement of the cavities.

Figure 5C:
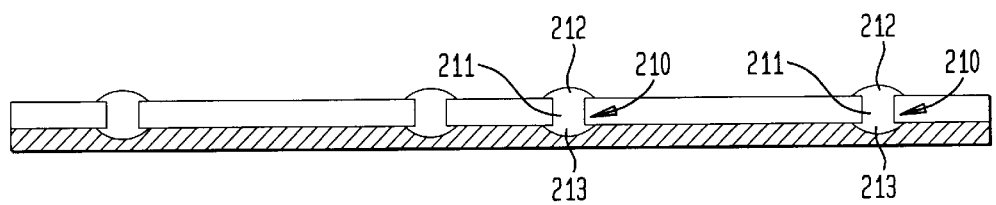

Conductive pads 210 are next plated into the cavities 203 and apertures 205 so as to create the rivet-like pads 210, as shown in FIG. 5C. These pads 210 have a bottom bump flange 213 adjacent to the sacrificial layer 200 and integrally attached to a post pad 211 such that the post pad protrudes from the bump flange 213. A second bump flange 212 is integrally attached to the opposite end of the post pad 211. Both bump flanges 212/213 have flange areas which extend beyond the diameter of the post pad 211. FIGS. 5I–5J show alternate cross-sectional pad configurations, according to the present invention. In the embodiment shown in FIG. 5I, the pad is comprised of the bottom bump flange 213' and the post pad 211'. In FIG. 5J, the bump flanges 212" and 213" extending from post 211" are more squared off at the edges when compared to the rounded/oval bump flanges shown the other Figures. Other shape bump flanges may also be used.

Figure 5D:
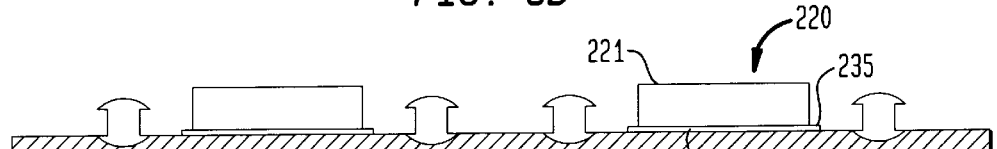
Figure 5E:
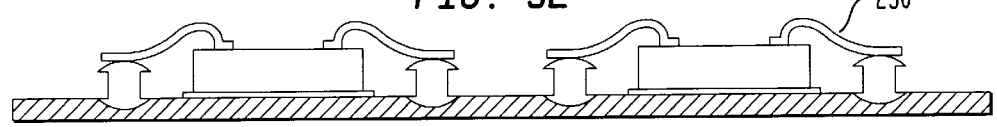
Figure 5F:
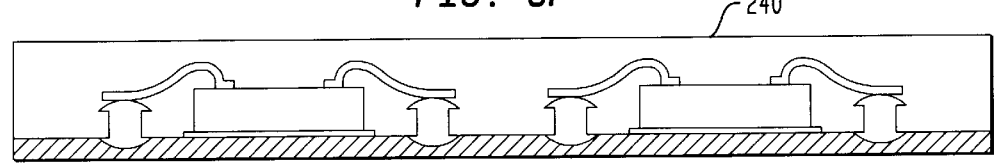
Figure 5G:
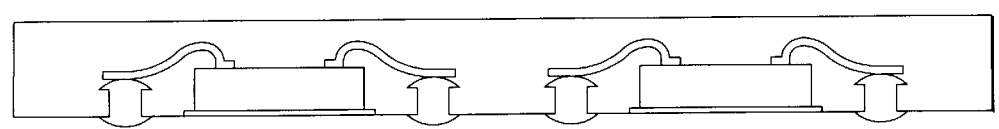
Figure 5H:
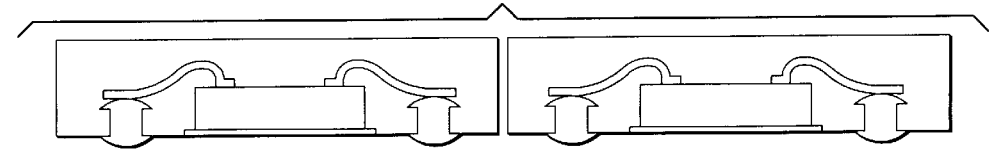
Figure 5I:
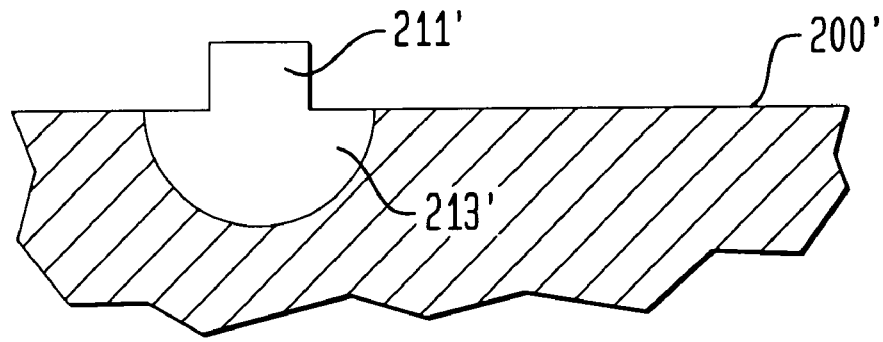
FIGS. 5I and 5J show a side view of alternate embodiments of the pad/post structure shown in FIGS. 5A through 5H, according to the present invention.
Figure 5J:
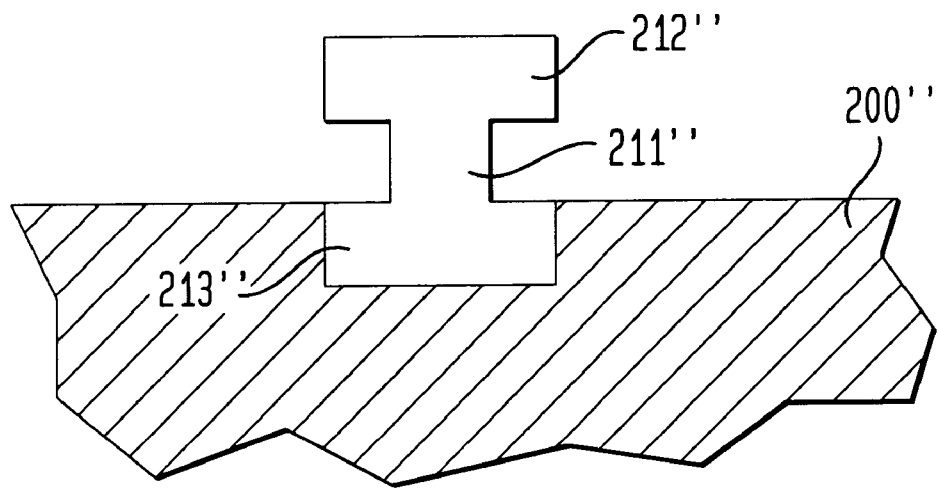

In FIG. 5D, the photo-imageable layer 204 is removed leaving the pads 210 such that the pads within a particular group define a central region therebetween. A chip 220 is next back-bonded to the first surface of the sacrificial layer 200 using a thermally conductive die attach adhesive 235, as described in the previous embodiment. FIG. 5E shows electrical connections 230 interconnecting the chip contacts (not shown) on the face surface 221 of the chip 220 and the pads 210. The electrical connections 230 are made by using a wirebonder to stitch bond both ends of the wire to the pad 210 and the chip contacts. The stitch bonds create a low profile electrical connection between the contacts and the pads which, in turn, allows the finished package to be thinner. The pads 210, chip 220, and wires 230 are then encapsulated, in a dielectric material 240 as described above in reference to FIG. 1 and further shown in FIG. 5F. The sacrificial layer is next etched away to expose the bottom bump flange 213, as shown in FIG. 2G. The packaged chips are then diced into either individual packaged chips or packaged multi-chip modules, as shown in FIG. 5H.

Figures 1, 6A:
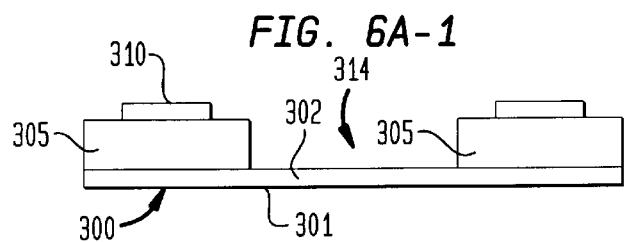
Figures 2, 6A:
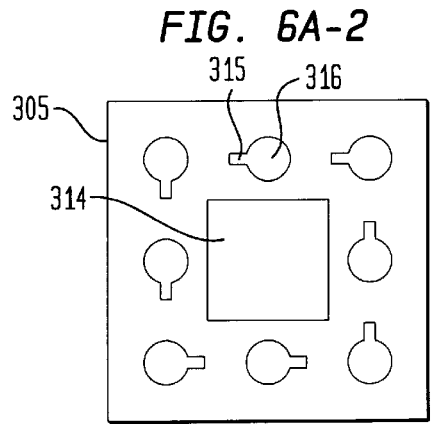
Figures 1, 6B:
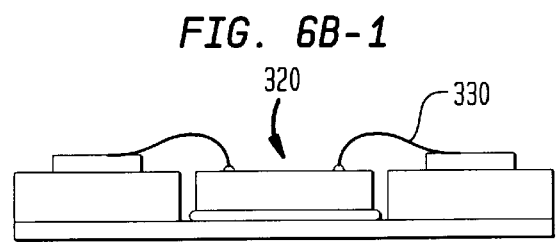

In a still further embodiment, FIGS. 6A–6F show another stackable chip arrangement. FIG. 6A-1 shows a side view in which a dielectric base material layer 305 is disposed on a top surface 302 of a sacrificial layer 300. The base material 305 is preferably comprised of a dielectric sheet-like layer, such as polyimide. Typically, the base material 305 is laminated onto the sacrificial layer 300. Conductive pads 310 are disposed on the base material 305. The pads 310 may be plated on the base material 305 prior or subsequent to the base material's attachment to the sacrificial layer 300. FIG. 6A-2 shows a top plan view of FIG. 6A-1. The pads 310 in FIG. 6A-2 have bonding sites 315 and via sites 316. The pads 310 further define a central cavity 314. As shown in FIG. 6B-1, a semiconductor chip 320 is then back-bonded to the first surface 302 of the sacrificial layer 300 within the central cavity. The chip contacts (not shown) are next electrically connected to respective bonding sites 315 on the pads 310. Typically, the contacts are wire-bonded using wires 330 to the respective bonding sites 315. FIG. 6B-2 shows a top plan view of FIG. 6B-1.

Figure 6C:
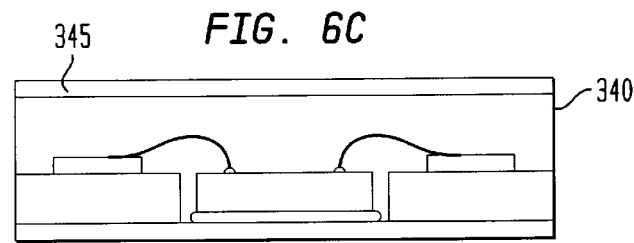
Figures 2, 6B:
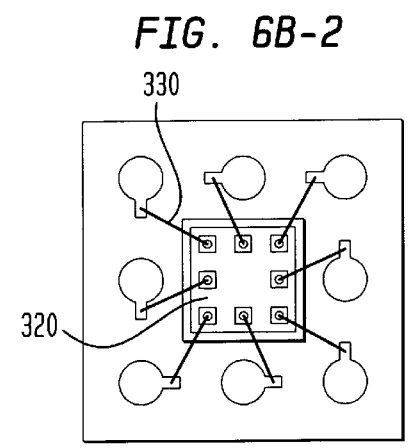
Figure 6D:
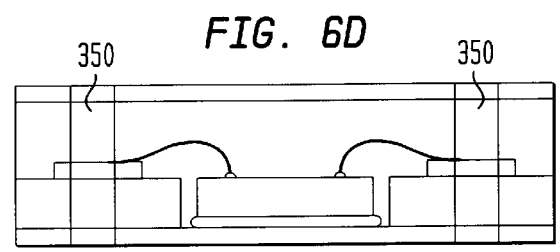
Figure 6E:
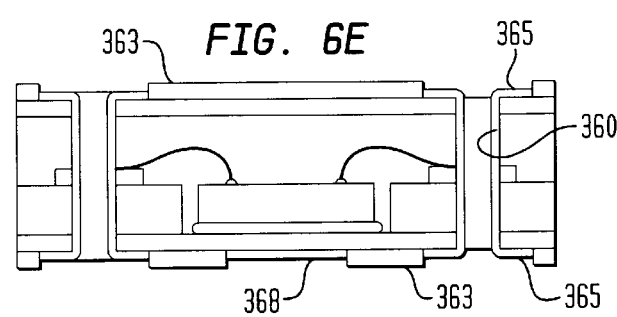

As shown in FIG. 6C, a curable, liquid encapsulant 340 next encapsulates the chip, pads and wires and is cured, as described above. A second conductive sacrificial layer 345 is then disposed on the exposed surface of the encapsulant 340. The second sacrificial layer 345 is typically laminated onto the encapsulant 340. As shown in FIG. 6D, apertures 350 are next drilled through the cured dielectric material such that the aperture side walls extend through the package from a top surface to a bottom surface thereby creating a via through at least some of the conductive pads 310 at the via sites 316. As shown in FIG. 6E, the side walls 355 of the apertures 350 are next plated with a conductive metal 360 so that a conductive path is created from one side of the aperture to the next extending completely through the package. The conductive metal 360 typically terminates on either side of the aperture 350 in flange portions 365. The shape and size of the flange portions are controlled through standard photo-lithographic means in which a dielectric photo-resist 363 is applied to the second sacrificial layer and developed so that the flange area may be removed therefrom. The photo-resist also allows the selective plating of a thermally conductive metal layer 368 on the second surface 301 of the first sacrificial layer 300.

Figures 2, 6F:
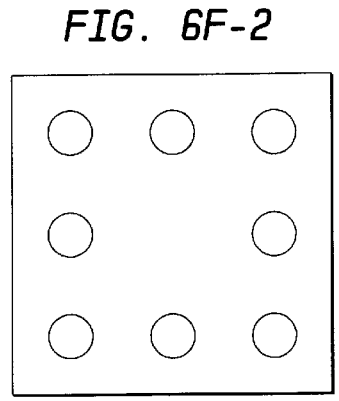
Figures 1, 6F:
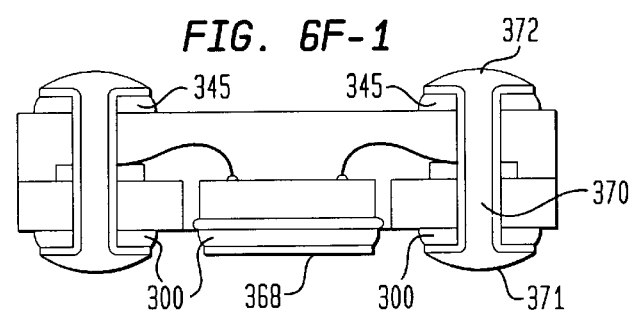

As shown in FIGS. 6F-1 and 6F-2, the first sacrificial layer 300 and the second sacrificial layer 345 are both etched such that only the portions under the flange portions 365 and the metal layer 368 remain. Alternately, the second sacrificial layer 345 could be selectively etched and used either as a ground/power layer or a wiring layer. The flange portions 365 and metal layer 368 are made of a material which is resistant to the etching solution used to etch the sacrificial layers. The plated conductive vias are next filled with conductive material 370, such as solder or metal filled epoxy, so that the conductive material 370 protrudes from the bottom of the vias 371 and at the top of the vias 372. This arrangement allows the bottom of the via to be electrically connected to a PWB while also allowing the top of the via 372 to be connected to another chip package as in a vertical chip stacking arrangement. The metal layer may be connected to a heat sink in the PWB so that heat may be directed away from the chip during operation. If the combination of the first sacrificial layer 300 and the metal layer 368 are thick enough, they may also serve the function of stretching any solder connections between the package and the PWB in order to obtain solder columns which are more able to withstand the expansion and contraction of the package/PWB during thermal cycling of the chip 320.

Figure 7A:
FIGS. 7A through 7E show a side view of an alternate method of manufacturing a semiconductor chip up to the encapsulation step, according to the present invention.
Figure 7B:
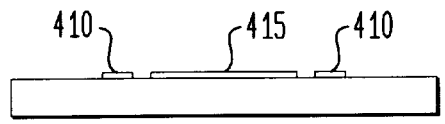
Figure 7C:
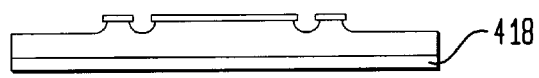
Figure 7D:
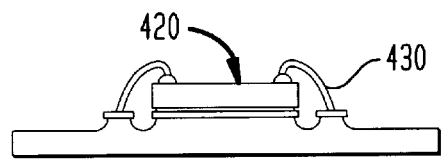
Figure 7E:
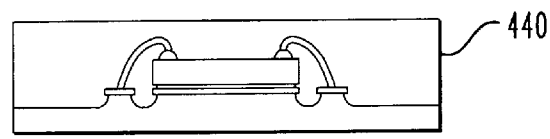

A still further embodiment of the present invention is shown in FIGS. 7A–7G. In FIG. 7A, a sacrificial sheet 400 comprised of copper is first provided. Next, gold is selectively electroplated onto the first surface 401 of the sacrificial sheet 400 so as to define pad regions 410 and a central conductive region 415 positioned between the pad regions 410, as shown in FIG. 7B. The second surface 402 of the sacrificial sheet 400 is then covered with a photo-resist 418, as shown in FIG. 7C, and the first surface 401 of the sacrificial sheet 400 is etched. The etchant used should etch the sacrificial sheet more readily than it etches the gold pads/central region. Cupric chloride is one such etchant which might be used if the sacrificial sheet is comprised of copper. The controlled etching process causes the pads 410 and central region 415 to protrude from the surface of the sacrificial sheet 400. One skilled in the art will appreciate that other materials may be used for the sacrificial sheet 400 and pads/central region 410/415 to achieve the same results. As shown in FIG. 7D, a semiconductor chip 420 is next back bonded to the central region 415 and the chip contacts (not shown) on the exposed surface of the chip 420 are electrically connected to respective pads 410 using a wirebonding machine to attach the wires 430 therebetween. The next step in the process, shown in FIG. 7E, includes encapsulating the elements of the chip package with a suitable curable, liquid encapsulant 440 and subsequently curing the encapsulant 440.

Figures 1, 7F:
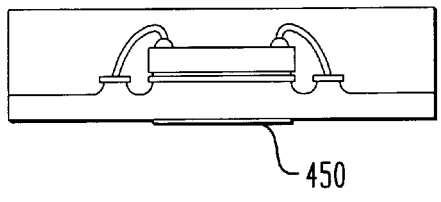
Figures 2, 7F:
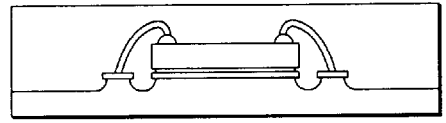
Figures 1, 7G:
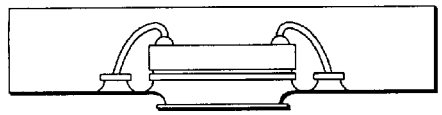
Figures 2, 7G:
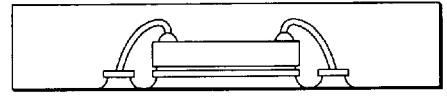

At this point, one of two different paths can be followed. First, as shown in FIGS. 7F-1 and 7G-1, a gold region 450 is selectively electroplated on the exposed surface of the sacrificial sheet 400 and the sheet is etched so that only the pads 410 and the central region 415 remain. In this case, the central region protrudes from the bottom of the package allowing it to be more easily attached to a PWB to provide a direct heat path away from the chip during operation of the device. The protruding central region 415 may also provide a method to stretch the solder balls attaching the exposed pads 410 to the PWB into solder columns so that they are more able to withstand the differential expansion and contraction of the package/PWB during operation of the device. With the second path, as shown in FIGS. 7F-2 and 7G-2, the sacrificial sheet 400 is etched such that the pads 410 and the central region 415 are planar with respect to the bottom of the package. The device may then be electrically connected to a PWB through the pads 410 and thermally connected to the PWB through the central region 415. In an alternate embodiment, the pads 410 may be etched during the sacrificial sheet etching step to create a cavity feature within each pad. These cavities may be used to facilitate solder ball placement on the pads 410.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A method of making a semiconductor chip package, comprising the steps of:

providing a first sacrificial layer;

providing a dielectric base material on the first sacrificial layer;

providing an array of conductive pads on said dielectric base material such that a central region is defined by the pads;

attaching a back surface of a semiconductor chip to the sacrificial layer within the central region so that a contact bearing surface of the chip faces away from the sacrificial layer;

electrically connecting each contact to a respective pad;

depositing curable dielectric material on the pads and chip such that the pads, electrical connections and chip are each encapsulated and curing the dielectric material;

providing a second sacrificial layer over the cured dielectric material;

forming apertures extending between the first and second sacrificial layers, at least some of said apertures extending through the cured dielectric material, through at least some of said pads and through the dielectric base material;

depositing a conductive metal in said apertures so as to form conductive vias extending between the sacrificial layers, at least some of said conductive vias being electrically connected to at least some of said pads; and removing at least a portion of each said sacrificial layer.

2. A method as claimed in claim 1 wherein said step of depositing a conductive metal is performed so as to form flange portions projecting outwardly from said conductive vias over the sacrificial layers.

3. A method as claimed in claim 2 wherein said removing is performed so as to remove the entirety of said sacrificial layers other than portions of said layers covered by said flange portions.

* * * * *

UNITED STATES PATENT AND TRADEMARK OFFICE
CERTIFICATE OF CORRECTION

PATENT NO. : 6,093,584
DATED : Jul. 25, 2000
INVENTOR(S) : Fjelstad

It is certified that error appears in the above-identified patent and that said Letters Patent is hereby corrected as shown below:

Title Page, item [54] "METHOD" should read --METHODS--.

Col. 1, line 1, "METHOD" should read --METHODS--.

Col. 6, line 21, "116" " should read --116'--.

Signed and Sealed this

Ninth Day of January, 2001

*Attest:*

Q. TODD DICKINSON

*Attesting Officer*         *Commissioner of Patents and Trademarks*

UNITED STATES PATENT AND TRADEMARK OFFICE
CERTIFICATE OF CORRECTION

PATENT NO. : 6,093,584  
DATED : July 25, 2000  
INVENTOR(S) : Fjelstad

Page 1 of 1

It is certified that error appears in the above-identified patent and that said Letters Patent is hereby corrected as shown below:

On the Title Page of the patent, please delete "[*] Notice: This patent is subject to a terminal disclaimer."

Signed and Sealed this

Twenty-sixth Day of June, 2001

Attest:

Attesting Officer

NICHOLAS P. GODICI
Acting Director of the United States Patent and Trademark Office